(12) United States Patent
Kikuta et al.

(10) Patent No.: US 7,202,567 B2
(45) Date of Patent: Apr. 10, 2007

(54) SEMICONDUCTOR DEVICE AND MANUFACTURING METHOD FOR THE SAME

(75) Inventors: Kuniko Kikuta, Kanagawa (JP); Makoto Nakayama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/090,112

(22) Filed: Mar. 28, 2005

(65) Prior Publication Data

US 2005/0218520 A1 Oct. 6, 2005

(30) Foreign Application Priority Data

Mar. 30, 2004 (JP) .............................. 2004-101586

(51) Int. Cl.
*H01L 23/48* (2006.01)
*H01L 23/52* (2006.01)
*H01L 29/40* (2006.01)
*H01L 29/00* (2006.01)
*H01L 29/861* (2006.01)

(52) U.S. Cl. ...................... 257/758; 257/750; 257/923; 257/924; 257/774; 257/775; 257/533; 257/595; 257/602

(58) Field of Classification Search ..................... None
See application file for complete search history.

(56) References Cited

U.S. PATENT DOCUMENTS

| | | | |
|---|---|---|---|
| 6,410,386 B1 * | 6/2002 | Hsue et al. ................. | 438/253 |
| 6,614,643 B1 * | 9/2003 | Morita et al. ............ | 361/306.3 |
| 6,635,527 B1 * | 10/2003 | Greco et al. ................. | 438/250 |
| 6,657,247 B2 * | 12/2003 | Yoshiyama et al. ......... | 257/303 |
| 6,740,974 B2 * | 5/2004 | Yoshitomi .................... | 257/751 |
| 6,746,914 B2 * | 6/2004 | Kai et al. .................... | 438/253 |
| 6,750,138 B2 * | 6/2004 | Matsunaga et al. ......... | 438/623 |
| 6,764,915 B2 * | 7/2004 | Lee ............................. | 438/396 |
| 6,919,244 B1 * | 7/2005 | Remmel et al. ............ | 438/239 |
| 6,940,114 B2 * | 9/2005 | Oh et al. .................... | 257/296 |
| 7,008,841 B2 * | 3/2006 | Kim et al. .................. | 438/250 |
| 2001/0020713 A1 * | 9/2001 | Yoshitomi et al. .......... | 257/306 |

FOREIGN PATENT DOCUMENTS

JP 2003-264235 A 9/2003

* cited by examiner

*Primary Examiner*—Jasmine Clark
(74) *Attorney, Agent, or Firm*—Sughrue Mion, PLLC (57) ABSTRACT

A lower interconnection is provided on a semiconductor substrate. A MIM capacitive element is provided on a first interlayer insulation film in which the lower interconnection is buried, and includes a lower electrode, an upper electrode, and a dielectric film sandwiched therebetween. An upper interconnection is provided on a second interlayer insulation film in which the MIM capacitive element is buried. A contact electrically connects the lower electrode and the upper interconnection. The lower electrode is mainly formed of Al, so that they are lower in electrical resistance than barrier metal, and also low in stress value. Therefore, it becomes possible to widen the area of the lower electrode for electrically connecting the contact while restraining their influences on charge accumulation and close contact between the lower electrode and the insulation film. In addition, since the electrical resistance is lowered, the thickness of the lower electrode can be increased. Accordingly, the MIM capacitive element with a large capacitance can be manufactured with a high yield.

15 Claims, 5 Drawing Sheets

SEMICONDUCTOR DEVICE AND MANUFACTURING METHOD FOR THE SAME

BACKGROUND OF THE INVENTION

1. Technical Field of the Invention

The present invention relates to a semiconductor device including a capacitive element with an MIM structure.

2. Description of the Related Art

An RF (radio-frequency) analog device comprises active elements for handling high-frequency signals and passive elements such as resistive elements and capacitive elements. In RF analog devices, reduction of parasitic resistances and parasitic capacitances is demanded in view of improvement in high-speed operability and reduction in power consumption. Therefore, in capacitive elements, an MIM (Metal-Insulator-Metal) capacitive element is widely used in which parasitic resistances and parasitic capacitances are remarkably smaller than those of conventional MOS capacitive elements.

On the other hand, a structure in which such an RF analog device is installed inside a logic device and formed into one chip has also been developed. In order to realize such a structure, integration of the structures and manufacturing processes of these devices is required. In a logic device, in view of high-speed operability of the element and reduction in power consumption, a structure including multilayer copper interconnections is generally used. It is an important technical object how the structure or processes of the MIM capacitive elements are adapted to such a copper multilayer interconnection structure.

Herein, when the MIM capacitive element is applied to the copper multilayer interconnection structure, it is considered that a part of the copper interconnection is commonly used as an electrode of the MIM capacitive element. However, the copper interconnection is usually formed by a damascene process, so that it is difficult to satisfactorily obtain flatness of the surface due to dishing. This problem of dishing becomes conspicuous when a Cu layer with a wide surface area like an electrode part of the capacitive element is formed, and it is very difficult to form the electrode part of the MIM capacitive element by a Cu film.

Figure 1:
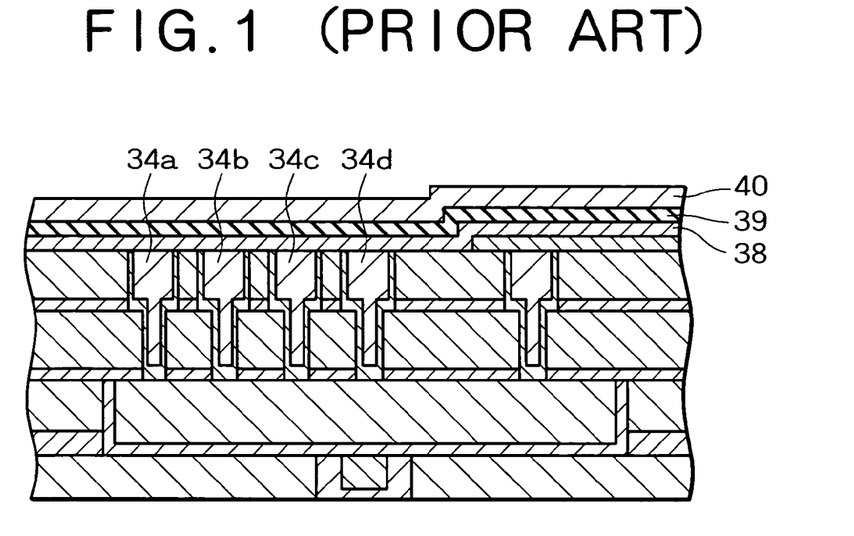
FIG. 1 is a sectional view showing the structure of a semiconductor device including a capacitive element having a conventional MIM structure.

On the other hand, Japanese Published Unexamined Patent Publication No. 2003-264235 discloses a semiconductor device in which a Cu interconnection structure is connected to the lower surface of a lower electrode of an MIM capacitive element and charges are supplied to the lower electrode via the Cu interconnection. The semiconductor device disclosed in this publication is shown in FIG. 1. As shown in FIG. 1, on the copper interconnections 34a through 34d, a TIN film 38, an $SiO_2$ film 39, and a TIN film 40 are formed in order so as to have film thicknesses of 100 nm, 40 nm, and 150 nm, respectively, and the TiN film 38 is a lower electrode of the MIM.

However, the capacitive element disclosed in said publication has the following problems. First, since a structure in which the lower electrode of the capacitive element is layered on the copper interconnections via a barrier metal is provided, it is still difficult to obtain flatness of the lower electrode. Second, the barrier metal is normally made of a high-resistance material, so that the resistance of the lower electrode becomes high. It is considered that the resistance is lowered by increasing the film thickness, however, the barrier metal of TiN or the like is generally high in inner stress, and there is a limitation in the increase in film thickness. Third, the barrier metal is high in resistance and high in inner stress, so that an increase in area is difficult, and it is difficult to form a capacitive element with a large capacitance.

As described above, in the structure in which an MIM capacitive element is provided above the interconnections, the flatness of the lower electrode is degraded and the selection of the material of the lower electrode is restricted, and as a result, it becomes difficult to obtain a capacitive element with desired performance.

SUMMARY OF THE INVENTION

An object of the present invention is to provide a semiconductor device including a capacitive element having a highly reliable MIM structure.

A semiconductor device according to the present invention comprises:

a semiconductor substrate;

a lower interconnection provided above the semiconductor substrate;

a first interlayer insulation film in which the lower interconnection is buried;

an MIM capacitive element which is provided on the first interlayer insulation film and have a lower electrode, an upper electrode, and a dielectric film sandwiched between the upper electrode and the lower electrode;

a second interlayer insulation film in which the MIM capacitive element is buried;

an upper interconnection provided on the second interlayer insulation film; and a connecting part which electrically connect the lower electrode and the upper interconnection.

The present invention relates to a semiconductor device provided with an MIM capacitive element in region sandwiched between the lower interconnection and the upper interconnection. Since the lower electrode is formed on the first interlayer insulation film, the flatness of the lower electrode is improved. Furthermore, in the first interlayer insulation film, no members that connect the lower interconnection and the lower electrode are provided, and the lower electrode is electrically connected to the upper interconnection, so that the degree of freedom in selection of the material of the lower electrode is increased. As a result, the lower electrode can be reduced in resistance and increased in area. In the prior art, the lower electrode is provided in contact with the lower interconnection, and the lower electrode is formed above the lower copper interconnection or barrier metal provided on the lower copper interconnection, so that there is a definite limitation in selection of the material of the lower electrode. However, in the present invention, the lower electrode is connected to the upper interconnection, so that such limitation is eliminated.

In the present invention, the upper interconnection means the entirety of the interconnection group above the second interlayer insulation film. It is also possible that the upper electrode and the lower electrode are formed of different conductive materials. Herein, in some cases, required performance is different between the upper electrode and the lower electrode. For example, in some cases, it is preferable that the lower electrode is formed to have a wide area so as to be connected to the upper interconnection, and accordingly, it is desirable that a low-resistance material or the like is used. In some cases, since the upper electrode is formed above a capacity dielectric film, it is desirable that a material from which the upper electrode is formed excellent on the capacity dielectric film is used. By forming the upper electrode and the lower electrode from different conductive materials, for example, the materials of the electrodes can be independently selected so as to be preferable for the electrode forming process (etching for machining into an electrode shape, etc) of the MIM capacitive element. When elements such as resistive element and inductance element are formed in the same process at the same level as those of the electrodes, it becomes possible to select the electrode materials according to the design of this element.

In the present invention, the lower electrode and the upper electrode may be connected to the same upper interconnection, or may be connected to different upper interconnections. The upper interconnection may be copper interconnection, and also, the lower interconnection may be copper interconnection. In the present invention, the copper interconnection can be made of pure copper or copper alloy mainly includes copper. The lower electrode has a portion projecting outward more than the outer circumferential edge of the upper electrode, and a first connection plug may be connected to this portion. Thereby, the lower electrode and the upper interconnection can be preferably connected by the first connection plug. Furthermore, a first resistive element that is formed at the same level as the lower electrode and made of the same material so as to have the same film thickness as those of the lower electrode may be provided. And a second resistive element that is formed at the same level as the upper electrode and made of the same material so as to have the same film thickness as those of the upper electrode may be provided.

With this construction, a semiconductor device which includes an MIM capacitive element and a resistive element and is excellent in manufacturing efficiency is realized. In addition, an inductance element may be provided which includes a plurality of first conductors that are provided at the same level as the lower electrode and made of the same material so as to have the same film thickness as those of the lower electrode and a plurality of via holes connecting the upper interconnection and the first conductors. With this construction, a semiconductor device that includes an MIM capacitive element and an inductance element and is excellent in manufacturing efficiency is realized.

A manufacturing method for a semiconductor device according to the present invention comprises:

forming a lower interconnection on a semiconductor substrate;

forming a first interlayer insulation film in which the lower interconnection is buried;

forming an MIM capacitive element formed by layering a lower electrode, a dielectric film, and an upper electrode on the first interlayer insulation film;

forming a second interlayer insulation film in which the MIM capacitive element is buried;

forming a via hole in the second interlayer insulation film so as to reach the lower electrodes;

forming a connection plug by filling the via hole with conductive material; and forming an upper interconnection to be connected to the connection plug above the second interlayer insulation film.

According to the present invention, a semiconductor device provided with a capacitive element having a highly reliable MIM structure is obtained.

DETAILED DESCRIPTION OF THE PREFERRED EMBODIMENTS

Hereinafter, embodiments of the present invention are described with reference to the drawings. In all figures, the same components are denoted with the same numerals.

First Embodiment

Figure 2:
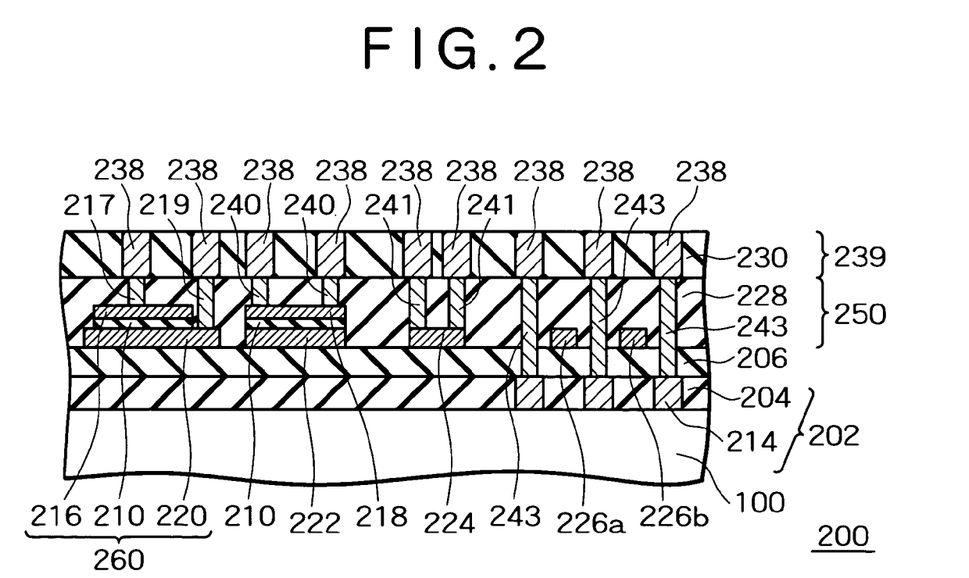
FIG. 2 is a sectional view showing the structure of a semiconductor device according to a first embodiment of the present invention.

A semiconductor device according to the first embodiment has a structure in which passive elements including an MIM capacitive element and a resistive element are provided in a logic circuit element including a multilayer copper interconnection. FIG. 2 is a sectional view showing the construction of a semiconductor device 200 according to this embodiment. The semiconductor device 200 has a structure in which a silicon substrate 100, a first copper interconnection layer 202, an interlayer insulation film 206, a passive element layer 250, and a second copper wiring layer 239 are layered in this order. The first copper interconnection layer 202 and the second copper interconnection layer 239 are copper interconnections in a multilayer interconnection including, for example, six to ten layers. The first copper interconnection layer 202 corresponds to a copper interconnection layer of the first layer immediately above a layer in which a transistor is formed. The second copper interconnection layer 239 corresponds to the copper interconnection layer as the second layer immediately above the layer in which the transistor is formed.

The first copper interconnection layer 202 has a structure in which a lower copper interconnection 214 is buried in an insulation film 204. The second copper interconnection layer 239 has a structure in which an upper copper interconnection 238 is buried in an insulation film 230.

In this embodiment, between these copper interconnection layers, a passive element layer 250 including passive elements such as an MIM capacitive element and a resistive element is disposed. The thickness of the passive element layer 250 is approximately 0.8 μm through 2 μm.

The via plug 240 electrically connects the upper copper interconnection 238 and the second resistive element 218, the via plug 241 electrically connects the upper copper interconnection 238 and the first resistive element 224, and the via plug 243 electrically connects the upper copper interconnection 238 and the lower copper interconnection 214. The contact 217 electrically connects the upper copper interconnection 238 and the upper electrode 216, and the contact 219 electrically connects the upper copper interconnection 238 and the lower electrode 220.

The passive element layer 250 is at a position sandwiched between the first copper interconnection layer 202 and the second copper interconnection layer 239 of the above-mentioned structure. In the passive element layer 250, passive elements such as a capacitive element 260 with an MIM structure, a second resistive element 218, and a first resistive element 224 are formed, and in addition, a dummy metal film 226a and a dummy metal film 226b are formed.

The capacitive element 260 consists of the upper electrode 216, the lower electrode 220, and a dielectric film 210 that is sandwiched between these two electrodes and functions as a capacity film. The lower electrode 220 has a portion projecting outward more than the outer circumferential edge of the upper electrode 216, and this projecting portion and the upper copper interconnection 238 are electrically connected by the contact 219. The upper electrode 216 is electrically connected to the upper copper interconnection 238 by the contact 217.

The lower electrode 220 is made of a metal film formed by laminating Ti, TiN, Al, Ti, and TiN in this order from the bottom. By forming the lower electrode from such a multilayer metal film containing Al, the resistance of the lower electrode can be lowered. As a result of lowering in electrode resistance, it becomes possible to increase the electrode area and improve the capacity. Herein, the thickness of the Al layer is preferably 100 nm or more, and more preferably, in a range between 100 nm and 200 nm. The thickness of the entire lower electrode 220 is preferably, for example, 400 nm.

The upper electrode 216 is formed from a barrier metal made of a refractory metal. Thereby, the upper electrode 216 has a resistance of several tens of ohms through several kilos of ohms, and can be made to function as a resistance of the upper electrode constituting the MIM capacitive element. In this embodiment, TaN is used as a material forming the upper electrode 216, however, for example, TiN, Ta, W, or the like may be used.

The dielectric film 210 functions as a capacitance film of the capacitive element. As a material for forming the dielectric film 210, a so-called High-K (high dielectric constant) material such as $ZrO_x$, $HfO_x$, $ZrSiO_x$, $HfSiO_x$, $Al_2O_3$, or the like and materials having perovskite structures such as PZT and PLZT, etc., can be used as well as $SiO_2$, SiON, SiOC, SiN, $Ta_2O_5$, etc. The film thickness of the dielectric film 210 is properly selected according to the material, and is set to, for example, 20 nm through 100 nm. In this embodiment, $SiO_2$ is used as the material and the film thickness is set to 50 nm.

Herein, the total thickness of the lower electrode 220, the dielectric film 210, and the upper electrode 216 is preferably set to 0.5 μm or less. Thereby, the yield of the via hole 236 can be improved. It is preferable that the thicknesses of the lower electrode 220 and the upper electrode 216 are set to be thick by considering influences from electrical resistance value increases. Therefore, it is preferable that the thickness of the dielectric film 210 is set to be thin, and as a result, the designable range of the capacitance of the MIM capacitive element can be widened. More preferably, the total thickness is set to 0.3 μm or less. Thereby, the flatness of the entirety of the passive element layer 250 becomes excellent, and the multilayer interconnection can be layered thereon with an excellent yield.

The first resistive element 224 is formed in the same step as forming the lower electrode 220 of the capacitive element 260. As a result, the first resistive element 224 and the lower electrode 220 are formed at the same level, and are formed from the same material so as to have the same film thickness. The first resistive element 224 is connected to the upper copper interconnection 238 by the via plug 241.

The second resistive element 218 is formed in the same step as forming the upper electrode 216 of the capacitive element 260. As a result, the second resistive element 218 and the upper electrode 216 are provided at the same level, and are made of the same material so as to have the same film thickness. The second resistive element 218 uses an upper electrode of the same lamination structure as that of the capacitive element 260, and this upper electrode is connected to the upper copper interconnection 238 by the via plug 240 so as to be used as a resistive element. The lower electrode 222 disposed below the second resistive element 218 is not connected to the interconnection and has a floating potential, and dose not function as an element.

As descried above, the first resistive element 224 is made of the same metal film containing Al as that of the lower electrode 220, and the second resistive element 218 is made of TaN that is the same material as that of the upper electrode 216. According to this embodiment, two resistive elements made of different materials can be formed in the same process as forming the capacitive element 260.

The dummy metal film 226a and the dummy metal film 226b are formed from the same material so as to have the same film thickness as those of the lower electrode 220, the lower electrode 222, and the first resistive element 224. The dummy metal film 226a and the dummy metal film 226b are not connected to the interconnections and have floating potentials, and do not function as elements.

Next, processes for manufacturing the semiconductor device 200 shown in FIG. 2 are described.

Figure 3A:
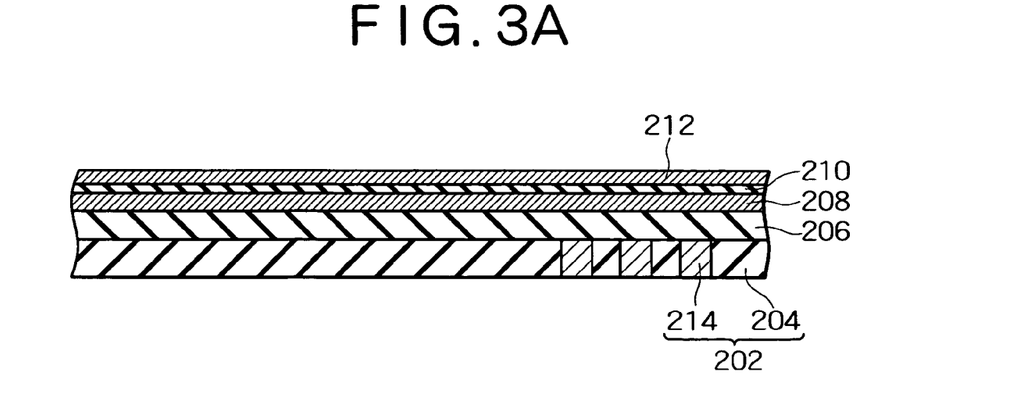
FIG. 3A through FIG. 3H are sectional views showing a manufacturing method for the semiconductor device of the first embodiment in order of steps.

FIG. 3A through FIG. 3H are sectional views showing the processes for manufacturing the semiconductor device 200 according to this embodiment. First, as shown in FIG. 3A, a structure is obtained in which the first copper interconnection layer 202 and the interlayer insulation film 206 are layered, and thereon, an Al-containing multilayer film 208, a dielectric film 210, and an upper conductive film 212 are layered in this order. First, an interconnection layer in which lower copper interconnections 214 are buried in the insulation film 204 is obtained by a damascene process. Next, thereon, an interlayer insulation film 206 is formed by CVD or the like. Thereafter, by sputtering, Ti, TiN, Al, Ti, and TiN layers are laminated in this order, whereby an Al-containing multilayer film 208 having a 5-layer structure is formed. On this Al-containing multilayer film 208, a dielectric film 210 is formed by CVD or the like, and thereon, an upper conductive film 212 is formed by sputtering or the like (FIG. 3A). Herein, a material for forming the interlayer insulation film 206 and the dielectric film 210, a so-called High-K (high dielectric constant) material such as $ZrO_x$, $HfO_x$, $ZrSiO_x$, $HfSiO_x$, $Al_2O_3$, or the like and materials having perovskite structures such as PZT and PLZT, etc., can be used as well as $SiO_2$, SiON, SiOC, SiN, $Ta_2O_5$, etc. Herein, the film thicknesses of the interlayer insulation film 206 and the dielectric film 210 are properly selected according to the material, however, in this embodiment, SiOF is used as a material of the interlayer insulation film 206, and $SiO_2$ is used as a material of the dielectric film 210. The film thicknesses are set to 0.1 μm and 50 nm, respectively. The first copper interconnection layer 202 has the lower copper interconnections 214 formed in the insulation film 204.

The Al-containing multilayer film 208 has a structure in which Ti, TiN, Al, Ti, and TiN are laminated in this order from the lower side of the figure, and is mainly formed by the Al layer. Herein, the thickness of the Al layer is 100 nm or more, and preferably, in the range between 100 nm and 200 nm. The thickness of the Al-containing multilayer film 208 is set to, for example, 400 nm.

The upper conductive film 212 is formed from a barrier metal made of a refractory metal. In this embodiment, TaN is used, however, for example, TiN, Ta, W, or the like may be used.

Herein, preferably, the total thickness of the upper conductive film 212, the dielectric film 210, and the Al-containing multilayer film 208 is 0.5 μm or less. Thereby, the designable range of the capacitance of the capacitive element 260 can be widened. More preferably, the total thickness is set to 0.3 μm or less. Thereby, the flatness of the entirety of the passive element layer 250 becomes excellent and the multilayer interconnections to be layered thereon can be formed with an excellent yield.

Figure 3B:
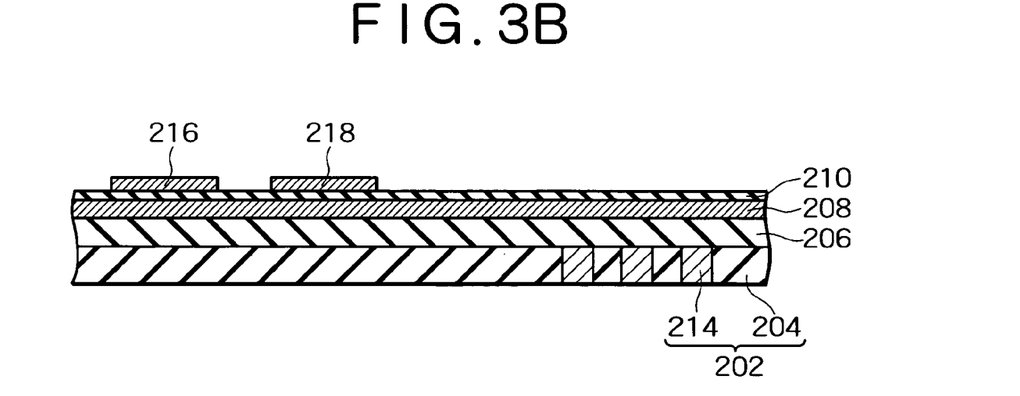

For defining regions in which the upper electrode 216 and 218 described later are formed, a resist film is formed on the upper conductive film 212 to form a resist pattern by photolithography. Next, the upper conductive film 212 is dry etched selectively using the resist pattern as a mask, whereby an upper electrode 216 constituting the capacitive element 260 and a second resistive element 218 to be used as a resistive element are formed (FIG. 3B).

Figure 3C:
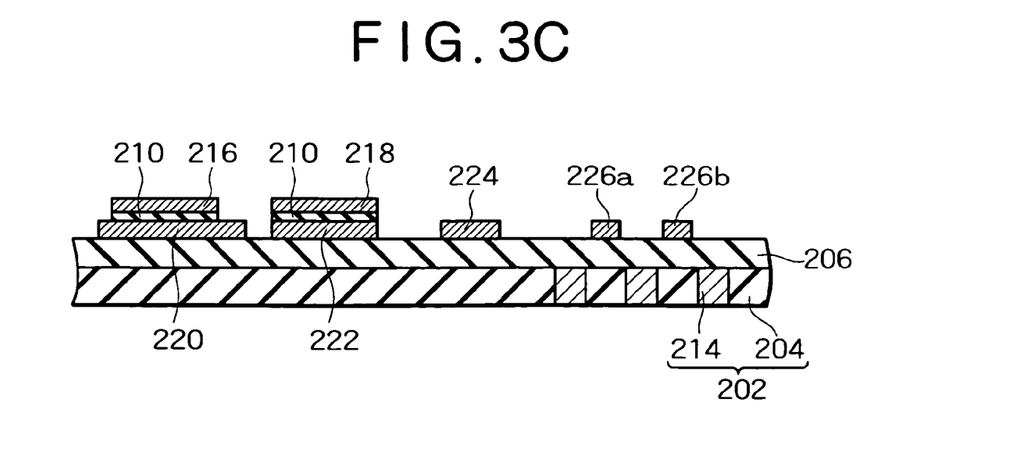

For defining regions in which the lower electrode 220 and the like described later are formed, a resist film is formed on the dielectric film 210, the upper electrode 216, and the second resistive element 218, and a resist pattern is formed by photolithography of the resist film. Next, dry etching is selectively applied using the resist pattern as a mask, whereby the dielectric film 210 is partially removed, and simultaneously, the lower electrode 220 constituting the capacitive element 260, the lower electrode 222 as a floating electrode, the first resistive element 224 to be used as a resistive element, the dummy metal film 226a and the dummy metal film 226b that are not used as interconnections but are used as dummies are formed (FIG. 3C).

Figure 3D:
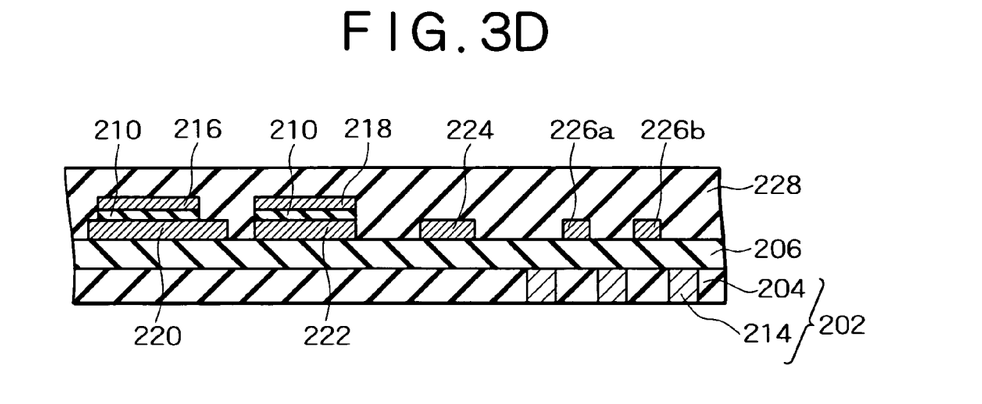

After an interlayer insulation film 228 is formed by using CVD or the like, the interlayer insulation film 228 is flattened by, for example, the CMP (Chemical Mechanical Polishing) technique (FIG. 3D). As a material forming the interlayer insulation film 228, a so-called High-K (high dielectric constant) material such as $ZrO_x$, $HfO_x$, $ZrSiO_x$, $HfSiO_x$, $Al_2O_3$, or the like and materials having perovskite structures such as PZT and PLZT, etc., can be used as well as $SiO_2$, SiON, SiOC, SiN, $Ta_2O_5$, etc. Herein, the total thickness of the interlayer insulation film 206 and the interlayer insulation film 228 is approximately 0.8 μm through 2 μm.

Figure 3E:
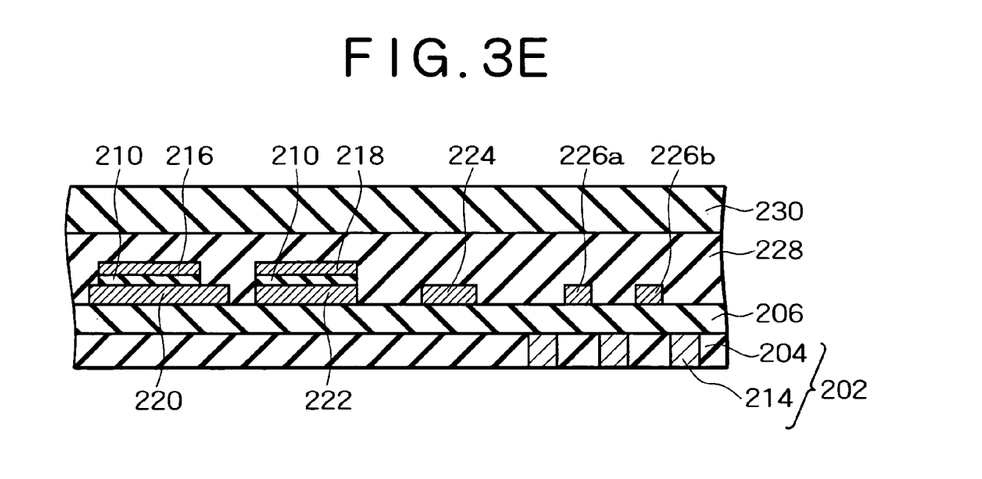

On the interlayer insulation film 228, an insulation film 230 is formed by CVD or the like (FIG. 3E). As a material forming the insulation film 230, a so-called High-K (high dielectric constant) material such as $ZrO_x$, $HfO_x$, $ZrSiO_x$, $HfSiO_x$, $Al_2O_3$, or the like and materials having perovskite structures such as PZT and PLZT, etc., can be used as well as $SiO_2$, SiON, SiOC, SiN, $Ta_2O_5$, etc.

Figure 3F:
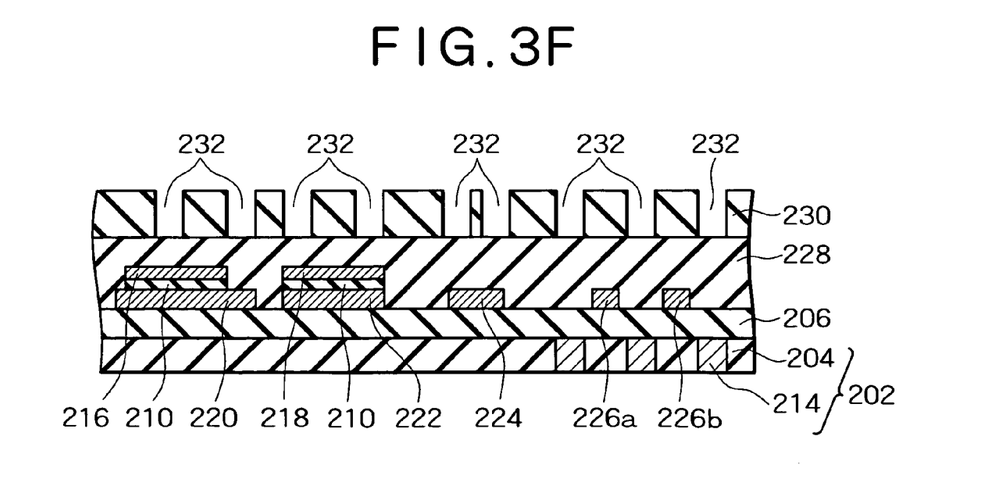

For defining regions in which copper interconnection grooves 232 are formed in the insulation film 230, a resist film is formed on the insulation film 230, and a resist pattern is formed by photolithography of the resist film. Next, the resist pattern is used as a mask and dry etching is applied, whereby the insulation film 230 is partially removed and the copper interconnection grooves 232 are formed (FIG. 3F).

Figure 3G:
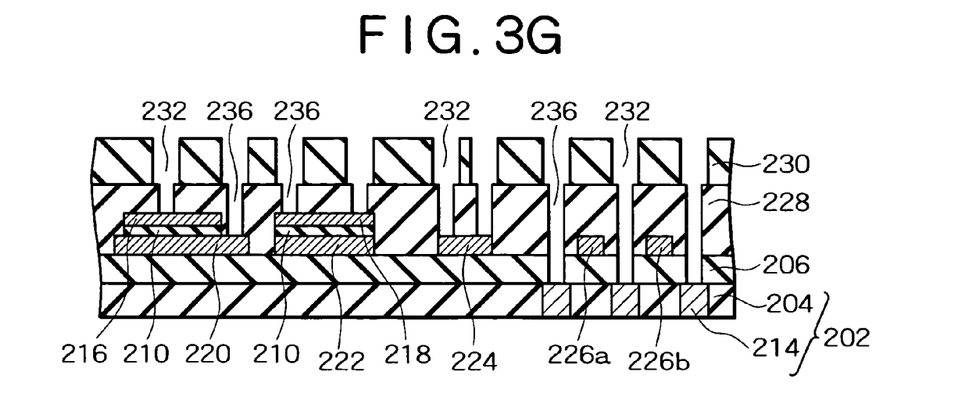

A resist film is formed on the insulation film 230 so as to bury the copper wiring grooves 232 therein. Next, a resist pattern is formed on the resist film by photolithography. Then, the interlayer insulation film 228 and the interlayer insulation film 206 are dry etched using the resist pattern as a mask so as to be partially removed. Through these procedures, the via holes 236 are formed in the interlayer insulation film 228 and the interlayer insulation film 206 (FIG. 3G).

Figure 3H:
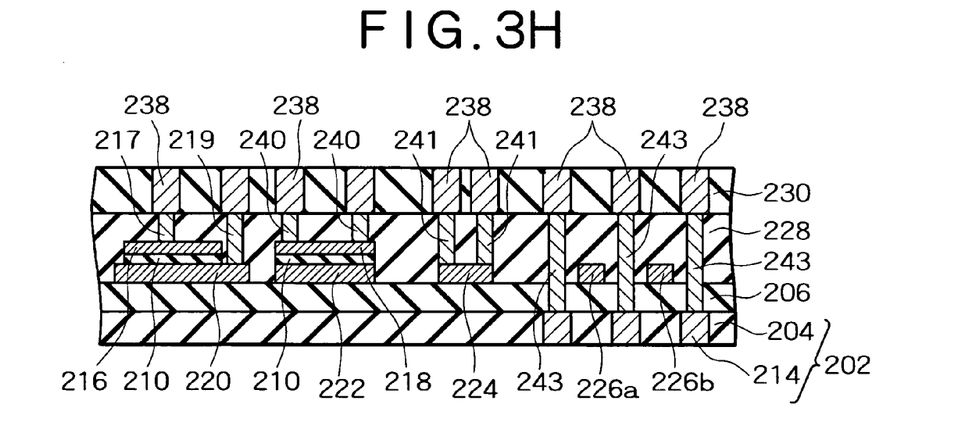

Barrier metal films (not shown) made of, for example, W, WN, Ta, TaN, Ti, or TiN, etc., are formed by sputtering, etc. in the via holes 236 and the copper interconnection grooves 232. Next, on the barrier metals, copper films are formed so as to bury the via holes 236 and copper interconnection grooves 232 therein by, for example, electrolytic plating. Then, the surfaces of the copper films are flattened by using the CMP technique, and thereafter, unnecessary barrier metals and copper films are removed, whereby the contact 217, the contact 219, the via plugs 240, the via plugs 241, the via plugs 243, and the upper copper interconnections 238 electrically connecting the contacts and the via plugs are simultaneously formed (FIG. 3H).

The effects of the semiconductor device 200 of this embodiment are described hereinafter. In this embodiment, the capacitive element 260 having an MIM structure is provided between the first copper interconnection layer 202 and the second copper interconnection layer 239 constituting a multilayer interconnection layer. Therefore, a semiconductor device that is excellent in manufacturing efficiency and device layout efficiency is realized. In design of a multilayer interconnection pattern in a logic circuit element, a method in which necessary points are corrected while using the previously formed circuit pattern is frequently used. According to this embodiment, such a method can be preferably realized. Namely, to change the circuit pattern of the passive elements, only the design of the passive element layer 250 is changed, and such a design change does not influence other interconnection layers. Therefore, in comparison with the construction in which MIM capacitive elements are provided in the uppermost layer of the multilayer interconnection layer while mixing interconnections therein like the prior art represented by the technique disclosed in Japanese Published Unexamined Patent Publication No. 2003-264235, a semiconductor device having excellent manufacturing yield that remarkably reduces the lead time for element design is realized. In addition, in comparison with the structure in which passive elements are provided in spaces inside the copper interconnection layer, the degree of freedom in layout of passive elements is improved.

In addition, this embodiment employs a structure in which the lower electrode 220 of the capacitive element 260 is connected to the upper copper interconnection 238 by the contact 219. The area of the lower electrode 220 is made larger than the area of the upper electrode 216, the outer edge of the lower electrode 220 projects outward more than the outer edge of the upper electrode 216, and the bottom of the contact 219 is connected to this projecting portion. Therefore, the lead time for element design is remarkably shortened, and a semiconductor device excellent in manufacturing efficiency is realized.

Depending on use of the passive circuit, it may be desired to be disposed in a layer below the multilayer interconnection. However, the interconnection layer positioned as a lower layer is generally high in interconnection density, and it is difficult to dispose passive elements in extra spaces. Therefore, in this embodiment, the passive element layer 250 is interposed between the lower copper interconnection and the upper copper interconnection. In such a case where the passive element layer is interposed, it is an important technical issue how to secure the electrical connection to the surrounding copper interconnections, however, this embodiment employs a structure in which the upper electrode 216 and the lower electrode 220 of the capacitive element 260 are connected to the upper copper interconnections 238. Therefore, an increase in film thickness due to provision of the passive element layer 250 is minimized. In addition, it is only required that the interconnections for applying a voltage to each electrode of the capacitive element 260 are provided only on the upper interconnection side, and the design change of the interconnection pattern in response to provision of the passive element layer 250 can be minimized. In addition, the contacts to be connected to the upper copper interconnections 238 can be formed in the same process as forming the via plugs (via plugs 240 and 241) disposed in other elements and the via plugs 243 electrically connecting the upper copper interconnections 238 and the lower copper interconnections 214, so that the manufacturing efficiency is also improved.

Herein, when the lower electrode 220 is made large as described above, the electrical resistance of the lower electrode 220 increases, and this makes it difficult to obtain desired charge accumulation and causes capacity scattering among a plurality of capacitive elements. As a result, it becomes difficult to obtain power supply stability when using the capacitive elements 260 having an MIM structure as batteries and high-speed operability in the case of use as elements forming an LC circuit. In order to solve these problems, it is considered that the lower electrode 220 is made thick and the electrical resistance of the lower electrode 220 is lowered, however, in the structure in which the lower electrode is formed of a barrier metal of TiN or Ti as in the prior art, the internal stress increases when the thickness of the lower electrode is increased, and close contact with surrounding insulation films is lowered. Correspondingly, the lower electrode 220 in this embodiment is mainly made of Al, so that it is lower in electrical resistance than the barrier metal, and is also lower in stress value. Therefore, it becomes possible to widen the area of the lower electrode 220 for joining by the contact 219 while restraining influences on charge accumulation and close contact between the lower electrode and the insulation films, and in addition, the thickness of the lower electrode 220 can be increased since the electrical resistance is lowered. As a result, according to this embodiment, the MIM capacitive elements with a capacity higher than conventionally can be manufactured with an excellent yield.

In this embodiment, the Al-containing multilayer film 208 is formed on the flattened interlayer insulation film 206, so that the Al-containing multilayer film 208, the dielectric film 210, and the upper conductive film 212 can be formed flat. Therefore, the flatness of the upper electrodes 216, the lower electrodes 220, and the dielectric films 210 sandwiched between them, constituting the capacitive elements 260 with an MIM structure, can be improved, whereby capacitive elements 260 with a desired capacity can be obtained. As a result, power supply stability when using the capacitive elements 260 as batteries and high-speed operability when using the capacitive elements 260 as elements forming an LC circuit can be obtained, so that a semiconductor device 200 including capacitive elements having a highly reliable MIM structure is realized.

Furthermore, in this embodiment, when forming the lower electrode 220 and the like by dry-etching the Al-containing multilayer film 208, the dummy metal film 226a and the dummy metal film 226b that are not used for interconnections are formed near the via plugs 243 electrically connecting the copper interconnections. Therefore, when forming the interlayer insulation film 228, it is formed not only on the first resistive element 224 but also on the dummy metal film 226a and the dummy metal film 226b. Therefore, in comparison with the case where interlayer insulation films are formed on a capacitive element and a resistive element without forming the dummy metal film, the height difference between the interlayer insulation film formed on the capacitive element 260 and the second resistive element 218 and the interlayer insulation film formed on the dummy metal film can be reduced. Therefore, the interlayer insulation film 228 can be flattened by the CMP technique or the like, and the insulation film 230 and the upper copper wiring 238 to be formed above the interlayer insulation film 228 can also be flattened. Therefore, the copper interconnection grooves 232 and the via holes 236 can be formed with excellent dimensional accuracy. As a result, the upper copper interconnection 238, the electrode, and the resistive element can be accurately connected, so that a semiconductor device 200 including a capacitive element with a highly reliable MIM structure is realized.

Furthermore, the total of the film thickness of the upper electrode 216 and the film thicknesses of the dielectric film 210 and the lower electrode 220, constituting the capacitive element 260, is set to 0.5 µm or less. Herein, it is preferable that the thicknesses of the lower electrode 220 and the upper electrode 216 are set to be thick by considering influences of electrical resistance increases on the designable range of the capacity of the MIM capacitive element. Therefore, it is preferable that the thickness of the dielectric film 210 as a capacitance film is set to be thin. Herein, the design range of the capacitance of the capacitive element including a thin capacitance film (dielectric film) can be set wide. Therefore, for the capacitive element 260, a desired capacitance can be obtained. In addition, the yield when forming the via holes 236 can be improved. Therefore, power supply stability when using the capacitive elements 260 as batteries and high-speed operability when using the capacitive elements 260 as elements forming an LC circuit can be obtained while improving the manufacturing stability in manufacturing processes of the semiconductor device 200 including the capacitive elements 260 with an MIM structure.

Furthermore, in this embodiment, the upper electrode is mainly made of TaN, and the lower electrode is mainly made of Al. Herein, it is necessary to provide resistive elements having various resistances in the circuit. In this embodiment, the resistance of the upper electrode and the resistance of the lower electrode are made different from each other without changing the area and the thickness of the material forming the resistive elements by using different materials for the upper electrode and the lower electrode. As a result, by arranging the resistive elements with different resistances in the circuit while improving the degree of integration, a semiconductor device 200 including capacitive elements having a highly reliable MIM structure is realized.

In this embodiment, the second resistive element 218 and the first resistive element 224 used as resistive elements are formed in the interlayer insulation film 228 positioned between the second copper interconnection layer 239 and the first copper interconnection layer 202. However, in the prior art represented by the Japanese Unexamined Patent Publication No, 2003-264235, the resistive elements are not formed in the same layer as that of the capacitive elements having an MIM structure, but are formed in a layer near the substrate. Therefore, they are influenced by parasitic capacitances generated between the substrate and the resistive elements, and desired resistances cannot be obtained. This tendency is conspicuous in a high-frequency region. On the other hand, in this embodiment, since the resistive elements are formed in the interlayer insulation film 228, influences from the parasitic capacitances generated between these and the substrate can be restrained. Therefore, the first resistive element 224 and the second resistive element 218 can obtain desired resistances.

In this embodiment, resistive elements with different resistances such as the second resistive element 218 and the first resistive element 224 are simultaneously formed on the same plane when forming the upper electrode 216 and the lower electrode 220 of the capacitive element with an MIM structure. Therefore, the process for forming resistive elements with different resistances in the semiconductor device 200 including capacitive elements 260 having an MIM structure can be simplified.

In this embodiment, by dry-etching the upper conductive film 212 formed on the dielectric film 210, the upper electrode 216 and the second resistive element 218 are simultaneously formed. In addition, by dry-etching the Al-containing multilayer film 208 formed on the interlayer insulation film 206, the lower electrode 220, the lower electrode 222, the first resistive element 224, the dummy metal film 226a, and the dummy metal film 226b are simultaneously formed. Therefore, the processes for manufacturing the semiconductor device 200 including the capacitive elements 260 having an MIM structure can be simplified.

Second Embodiment

Figure 4:
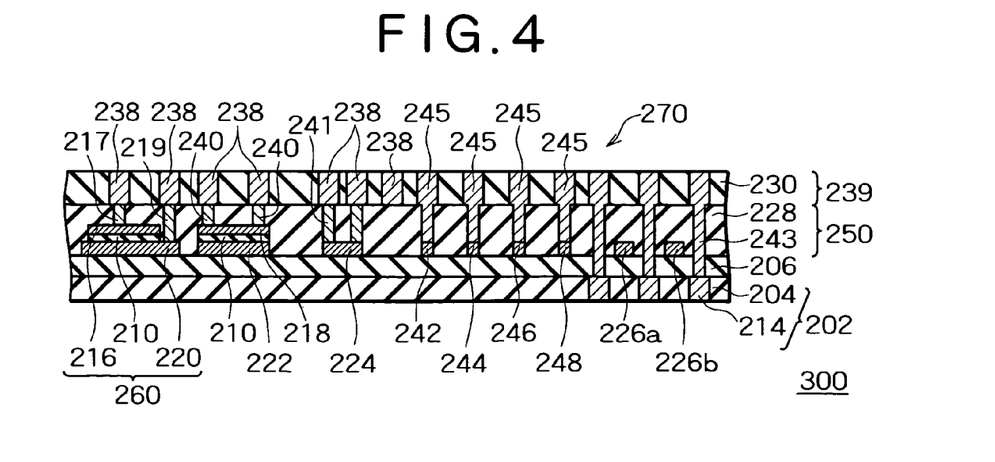
FIG. 4 is a sectional view showing the structure of a semiconductor device according to a second embodiment of the present invention.
Figure 5:
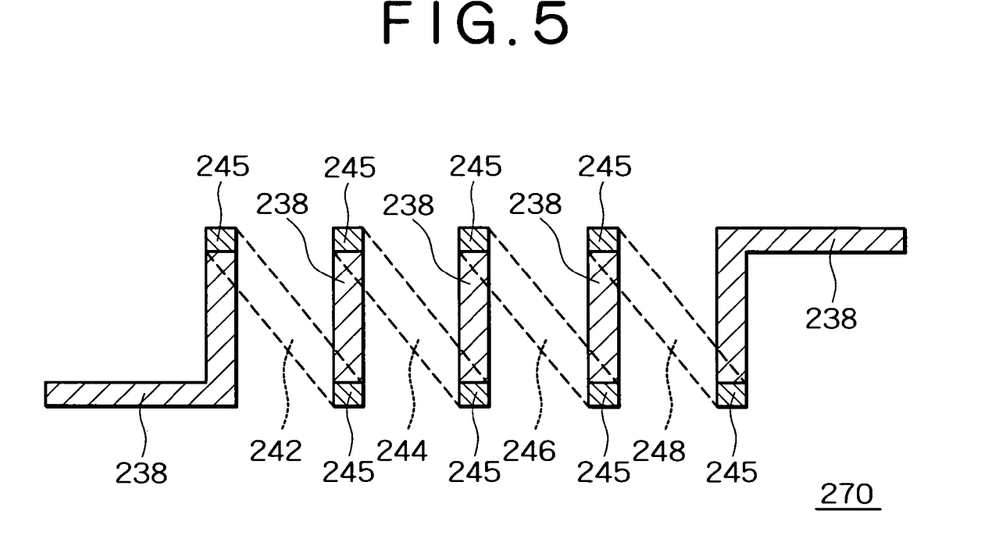
FIG. 5 is a plan view of the same.

Next, a second embodiment of the present invention is described. A semiconductor device according to this embodiment is provided with inductive element in the same layer including MIM capacitive element. FIG. 4 is a sectional view showing the construction of the semiconductor device 300 of this embodiment, and FIG. 5 shows the structure of the inductive element 270 of FIG. 4 viewed from above. In FIG. 5, the inductive element 270 includes a first conductor 242, a second conductor 244, a third conductor 246, a fourth conductor 248, via plugs 245, and upper copper interconnections 238, the first conductor 242, the second conductor 244, the third conductor 246, and the fourth conductor 248 being provided at the same level as the lower electrode 220. Herein, connection is made between the end of the first conductor 242 and the via plugs 245, between the end of the second conductor 244 and the via plug 245, between the end of the third conductor 246 and the via plug 245, and between the end of the fourth conductor 248 and the via plug 245. In FIG. 5, the upper copper interconnection 238, the via plug 245, the first conductor 242, the via plug 245, the upper copper interconnection 238, the via plug 245, the second conductor 244, the via plug 245, the upper copper interconnection 238, the via plug 245, the third conductor 246, the via plug 245, the upper copper interconnection 238, the via plug 245, the fourth conductor 248, the via plug 245, and the upper copper interconnection 238 are joined in this order to form an inductive element 270. Namely, the inductive element 270 has a structure in which conductors are wound around an axis almost horizontal to the substrate surface. Therefore, when the inductive element 270 is energized, a magnetic field is generated in the direction horizontal to the substrate surface.

Next, the manufacturing processes of the semiconductor device 300 are described with reference to FIG. 4. The manufacturing processes of the semiconductor device 300 are different from those of the first embodiment in that the first conductor 242, the second conductor 244, the third conductor 246, and the fourth conductor 248 forming the inductive element 270 are formed and the via plugs 245 are connected to electrodes constituting the inductive element 270.

After the step of FIG. 3A described in the first embodiment, a resist film is formed on the upper conductive film 212, and a resist pattern is formed by photolithography. Then, the resist pattern is used as a mask and dry-etching is selectively applied to the upper conductive film 212, whereby the upper electrode 216 and the first resistive element 218 are formed.

Next, for determining regions in which lower electrodes are formed, a resist film is formed on the dielectric film 210, the upper electrode 216, and the second resistive element 218, and a resist pattern is formed by photolithography. Next, by applying dry-etching by using the resist pattern as a mask, the dielectric film 210 is partially removed, and simultaneously, the lower electrode 220 forming the capacitive element 260, the lower electrode 222 as a floating electrode, the first resistive element 224 to be used as a resistive element, the dummy metal film 226a and the dummy metal films 226b that are not used as interconnections but are used as dummies, and the first conductor 242, the second conductor 244, the third conductor 246, and the fourth conductor 248 constituting the inductor are formed.

Then, an interlayer insulation film 228 is formed by CVD or the like, and then the interlayer insulation film 228 is flattened by using, for example, the CMP technique. As a material for forming the interlayer insulation film 228, a so-called High-K (high dielectric constant) material such as $ZrO_x$, $HfO_x$, $ZrSiO_x$, $HfSiO_x$, $Al_2O_{31}$ or the like and materials having perovskite structures such as PZT and PLZT, etc., can be used as well as $SiO_2$, SiON, SiOC, SiN, $Ta_2O_5$, etc. Herein, the total thickness of the interlayer insulation film 206 and the interlayer insulation film 228 is approximately 0.8 μm through 2 μm.

Next, on the interlayer insulation film 228, a insulation film 230 is formed by CVD or the like. As a material for forming the insulation film 230, a so-called High-K (high dielectric constant) material such as $ZrO_x$, $HfO_x$, $ZrSiO_x$, $HfSiO_x$, $Al_2O_3$, or the like and materials having perovskite structures such as PZT and PLZT, etc., can be used as well as $SiO_2$, SiON, SiOC, SiN, $Ta_2O_5$, etc.

Next, for defining regions in which the copper interconnection grooves 232 are formed in the insulation film 230, a resist film is formed on the insulation film 230, and a resist pattern is formed by photolithography. Next, by applying dry-etching by using the resist pattern as a mask, the insulation film 230 is partially removed to form copper interconnection grooves 232.

A resist film is formed on the insulation film 230 so as to bury the copper interconnection grooves 232 therein. Next, a resist pattern is formed on the resist film by photolithography. Then, the resist pattern is used as a mask and dry etching is applied, whereby the interlayer insulation film 228 and the interlayer insulation film 206 are partially removed. Through these procedures, via holes 236 are formed.

In the via holes 236 and the copper interconnection grooves 232, barrier metals made of, for example, W, WN, Ta, TaN, Ti, or TiN, etc., are formed. Next, copper films are formed on the barrier metals by, for example, electrolytic plating so as to bury the via holes 236 and the copper interconnection grooves 232 therein. Then, the surfaces of the copper films are flattened by using the CMP technique, and thereafter, unnecessary barrier metals and copper films are removed, whereby the contact 217, the contact 219, the via plugs 240, the via plugs 241, the via plugs 243, the via plugs 245, and upper copper interconnections 238 joining the contacts and the via plugs are simultaneously formed.

In this embodiment, the effects of the structure in which the inductors 270 are provided in the semiconductor device 300 are described below.

In this embodiment, the inductors 270 are provided in the layer between the second copper interconnection layer 239 and the first copper interconnection layer 202 almost horizontally to the substrate. Therefore, it becomes possible to layout the inductors 270 and provide the capacitive elements 260 having an MIM structure by effectively using the spaces between the multilayer copper interconnection layers. Therefore, it is not necessary to separately prepare a space for forming the coil, the coil is easily formed, and the coil can be formed by using a dead space, and this leads to space saving. In addition, magnetic fluxes of the coil are generated horizontally to the base material, so that interference with other members included in the semiconductor device 300 can be reduced. Thereby, other members can be designed without considering the coil installation location, and the degree of freedom in layout is increased. Therefore, a semiconductor device 300 having an LCR circuit using the capacitive element 260 with a highly reliable MIM structure and the inductor 270 is realized.

In this embodiment, the first conductor 242, the second conductor 244, the third conductor 246, and the fourth conductor 248 constituting the inductive element 270 is formed on the same plane as that of the lower electrode 200 or the like constituting the capacitive element 260, simultaneously, by dry-etching the Al-containing mutilator film 208. Therefore, the processes for manufacturing the semiconductor device 300 including an LCR circuit using the capacitive element 260 with an MIM structure and the inductor 270 can be simplified.

The invention is described above based on embodiments. These embodiments are simply examples, and it should be understood by persons skilled in the art that various modifications are possible and such modifications are included in the scope of the invention.

For example, in the above-mentioned embodiments, it is described that the interlayer insulation film 228 is flattened by providing a dummy metal film 226a and a dummy metal film 226b as dummies, however, it is also possible that the interlayer insulation film 228 is flattened by setting the total of the film thickness of the upper electrode and the film thickness of the lower electrode to 0.3 µm or less without providing the dummy metal film 226a and the dummy metal film 226b as dummies. By setting the total of the film thickness of the upper electrode and the film thickness of the lower electrode to 0.3 µm or less, the height differences in the interlayer insulation film 228 to be formed after forming the lower electrode 220, etc., are reduced, and the interlayer insulation film 228 is flattened by the CMP technique, etc. Therefore, it becomes possible to flatten the insulation film 230 and the upper copper interconnection 238 provided above the interlayer insulation film 228. Therefore, the via holes 236 can be formed at desired positions. As a result, the upper copper interconnections 238 and the lower electrodes 220 are accurately connected, so that a semiconductor device 200 including capacitive elements with a highly reliable MIM structure can be manufactured.

In the above-described embodiments, the lower copper interconnections 214 and the upper copper interconnections 238 are used, however, the interconnections can be made of copper alloy such as CuAl or CuSi.

In the above-described embodiments, the Al-containing multilayer film 208 is formed by laminating Ti, TiN, Al, Ti, and TiN in this order from the bottom in the figure, however, it may be made of Al only.

In the above-described embodiments, Al is used as a main material of the Al-containing metal film 208, however, it is also possible that an aluminum alloy such as Al—Si, Al—Si—Cu, or the like can be used as the Al-containing metal film 208.

In the above-described embodiment, TaN is used as a material for forming the upper conductive film 212, however, W, WN, Ta, Ti, or TiN can also be used.

In the above-described embodiments, Al is used as a main material for forming the Al-containing multilayer film 208 and TaN is used as a material for forming the upper conductive film 212, however, it is only required that the resistance of the material for forming the film to be formed above the interlayer insulation film 206 is lower than the resistance of the material for forming the upper conductive film 212.

In the above-described embodiments, a dual-damascene process is used, however, a single damascene process can also be used.

In the above-described embodiment, copper is used as a material for forming the via plugs, however, in the case where the single damascene process is used, for example, tungsten or the like may be used as the via plugs.

In the above-described embodiments, the inductive element 270 is formed by using four conductors including the first conductor 242, the second conductor 244, the third conductor 246, and the fourth conductor 248, however, the inductor may be formed by using six or eight conductors.

What is claimed is:

1. A semiconductor device comprises:
   a semiconductor substrate;
   a lower interconnection provided on the semiconductor substrate;
   a first interlayer insulation film in which the lower interconnection is buried;
   an MIM capacitive element which is provided on the first interlayer insulation film and has a lower electrode, an upper electrode, and a dielectric film sandwiched between the lower electrode and the upper electrode;
   a second interlayer insulation film in which the MIM capacitive element is buried;
   an upper interconnection provided on the second interlayer insulation film;
   a third interlayer insulation film provided between said first interlayer insulation film and said second interlayer insulation film, and said third interlayer insulation film is made from a material selected from a group consisting of $SiO_2$, SiOC and SiOF or a combination of materials selected from a group consisting of $SiO_2$, SiOC and SiOF; and
   a connecting part which electrically connects the lower electrode and the upper interconnection.

2. The semiconductor device according to claim 1, wherein the lower interconnection is a copper interconnection.

3. The semiconductor device according to claim 1, wherein the upper interconnection is a copper interconnection.

4. The semiconductor device according to claim 1, wherein the connecting part has a first connection plug which is provided in the second interlayer insulation film so as to electrically connect the lower electrode and the upper interconnection.

5. The semiconductor device according to claim 4, further comprising a second connection plug which is provided in the second interlayer insulation film so as to electrically connect the upper electrode and the upper interconnection.

6. The semiconductor device according to claim 4, wherein the lower electrode has a portion projecting outward more than the outer circumferential edge of the upper electrode, and the first connection plug is connected to this portion of the lower electrode.

7. The semiconductor device according to claim 1, wherein the upper electrode is electrically connected to the upper interconnection.

8. The semiconductor device according to claim 1, wherein the lower electrode includes an aluminum-containing film.

9. The semiconductor device according to claim 1, wherein the thickness of the lower electrode is 300 through 500 nm.

10. The semiconductor device according to claim 1, further comprising a first resistive element that is formed at the same level as the lower electrode and made of the same material with the same film thickness as the lower electrode.

11. The semiconductor device according to claim 10, further comprising a second resistive element that is formed at the same level as the upper electrode and made of the same material with the same film thickness as the upper electrode.

12. The semiconductor device according to claim 11, wherein the first resistive element and the second resistive element are made of different materials each other.

13. The semiconductor device according to claim 1, wherein a structural body having the same layer structure as that of the MIM capacitive element is provided in the same layer as the MIM capacitive element, and the structural body includes:
    one electrode that is not connected to an interconnection and
    the other electrode that functions as a resistive element connected to the upper interconnection.

14. The semiconductor device according to claim 1, further comprising:
    an inductive element, said inductive element including:
    a plurality of first conductors that are provided at the same level as the lower electrode and made of the same material with the same film thickness as those of the lower electrode; and
    a plurality of via holes that connect the upper interconnection and the first conductors.

15. A semiconductor device comprises:
    a semiconductor substrate;
    a lower interconnection provided on the semiconductor substrate;
    a first interlayer insulation film in which the lower interconnection is buried;
    an MIM capacitive element which is provided on the first interlayer insulation film and has a lower electrode, an upper electrode, and a dielectric film sandwiched between the lower electrode and the upper electrode;
    a second interlayer insulation film in which the MIM capacitive element is buried;
    an upper interconnection provided on the second interlayer insulation film; and
    a connecting part which electrically connects the lower electrode and the upper interconnection,
    wherein the upper electrode and the lower electrode are formed of different conductive materials each other.

* * * * *